United States Patent
Lee

(10) Patent No.: US 7,057,953 B2
(45) Date of Patent: Jun. 6, 2006

(54) SEMICONDUCTOR MEMORY DEVICE WITH STABLE AUTO-PRECHARGE OPERATION

(75) Inventor: Sang-Hee Lee, Ichon-shi (KR)

(73) Assignee: Hynix Semiconductor Inc., Ichon (KR)

( * ) Notice: Subject to any disclaimer, the term of this patent is extended or adjusted under 35 U.S.C. 154(b) by 7 days.

(21) Appl. No.: 11/015,472

(22) Filed: Dec. 20, 2004

(65) Prior Publication Data
US 2005/0162959 A1 Jul. 28, 2005

(30) Foreign Application Priority Data
Dec. 30, 2003 (KR) .................... 10-2003-0099699

(51) Int. Cl.
*G11C 7/00* (2006.01)

(52) U.S. Cl. ................ 365/203; 365/230.03; 365/233; 365/194

(58) Field of Classification Search .................... None
See application file for complete search history.

(56) References Cited

U.S. PATENT DOCUMENTS 6,483,579 B1 * 11/2002 Koshikawa ................ 356/233

* cited by examiner

*Primary Examiner*—David Lam
(74) *Attorney, Agent, or Firm*—Mayer, Brown, Rowe & Maw LLP

(57) ABSTRACT

A semiconductor memory device having a plurality of banks for stably performing a write with auto-precharge (WRA) command or a read with auto-precharge (RDA) command, including: a bank signal generation unit for generating an interrupt bank signal based on a bank address signal and a column address strobe (CAS) signal; a data access period detection unit for generating a data access period signal based on the CAS signal and a bit line disable signal; and a masking signal generation unit for generating a masking signal in order to controlling a logic level of an auto-precharge signal based on the data access period signal and the interrupt bank signal.

23 Claims, 11 Drawing Sheets

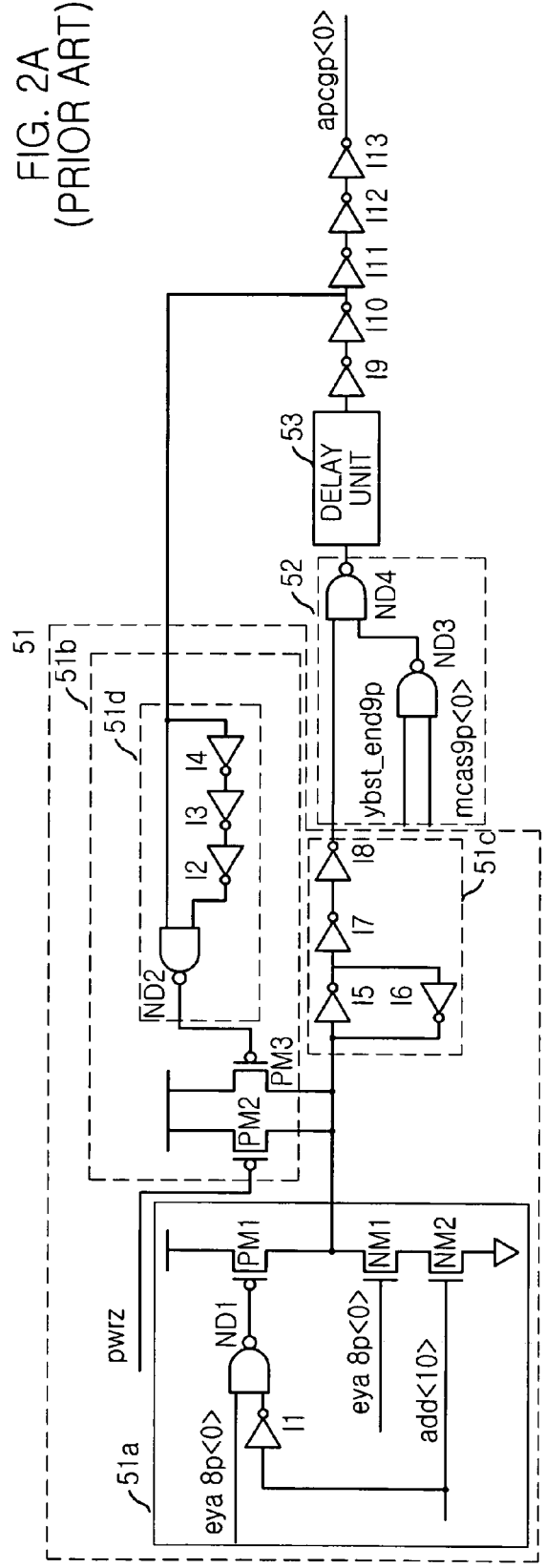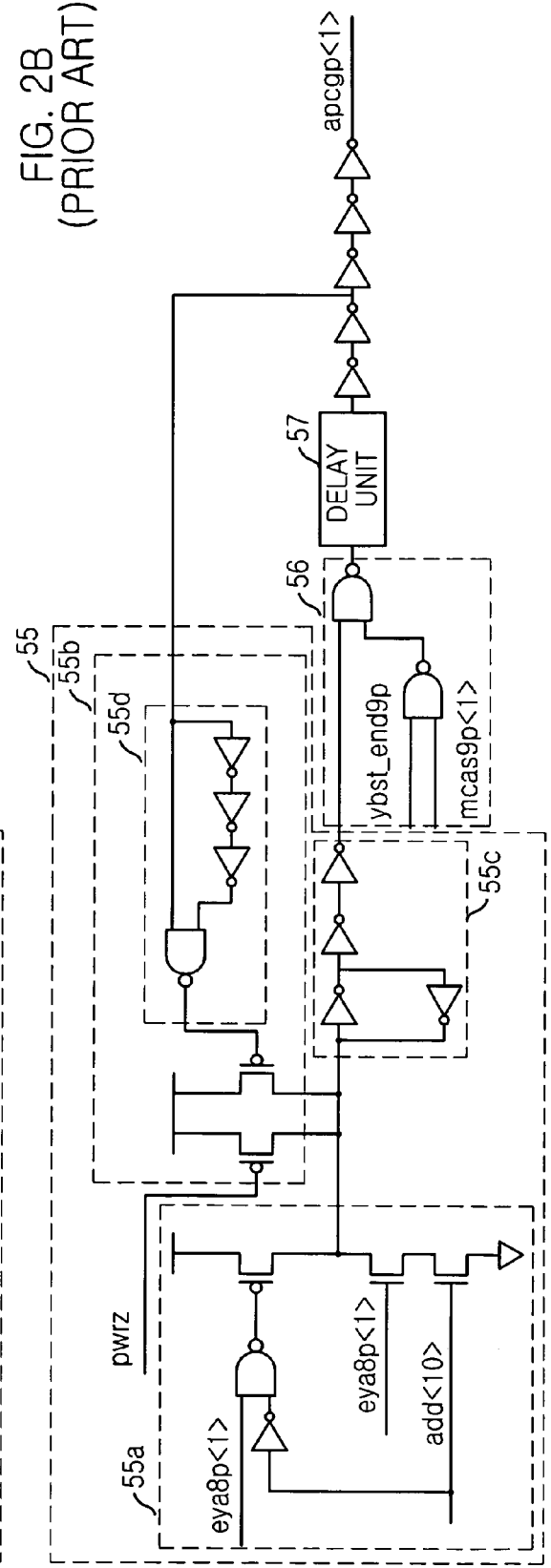

SEMICONDUCTOR MEMORY DEVICE WITH STABLE AUTO-PRECHARGE OPERATION

FIELD OF INVENTION

The present invention relates to a semiconductor memory device; and, more particularly, to a semiconductor memory device capable of stably performing an auto-precharge operation.

DESCRIPTION OF PRIOR ART

Generally, if a write with auto-precharge (WRA) command or a read with auto-precharge (RDA) command RDA is inputted to a dynamic random access memory (DRAM), after a write operation or a read operation is completed, a precharge signal is activated and a bit line is precharged in response to the precharge signal.

FIG. 1 is a block diagram showing a conventional auto-precharge control device included in a conventional DRAM. Herein, it is assumed that the conventional DRAM includes two banks, i.e., a first bank and a second bank.

As shown, the conventional auto-precharge control device includes an address buffer unit 10, a command decoding unit 20, a bank signal generation unit 30, a data access period detection unit 40 and an auto-precharge signal generation unit 50.

The address buffer unit 10 receives an address signal add_in to generate a bank address signal ba<0:1> and a single-bit address signal add<10>. The command decoding unit 20 decodes a plurality of external command signals, i.e., a chip selection signal CS, a row address strobe signal RAS, a column address strobe signal CAS and a write enable signal WE to generate a CAS pulse signal casp6. The bank signal generation unit 30 generates a bank selection signal eya8p<0:1> and an interrupt bank signal mcas9p<0:1> based on the bank address signal ba<0:1> and the CAS pulse signal casp6.

The data access period detection unit 40 receives the CAS pulse signal casp6, a power-up signal pwrz, and a bit line disable signal bl_dis in order to generate a data access period termination signal ybst_end9p and a data access period signal ybst. The auto-precharge generation unit 50 generates an auto-precharge signal apcgp<0:1> in response to the bank selection signal eya8p<0:1> when the data access period termination signal ybst_end9p is activated. Herein, a first bit and a second bit signals of the auto-precharge signal apcgp<0:1>, i.e., a first bit auto-precharge signal apcgp<0> and a second bit auto-precharge signal apcgp<1> are respectively inputted to the first bank and the second bank. In addition, the bank selection signal eya8p<0:1> includes a first bit bank selection signal eya8p<0> and a second bit bank selection signal eya8p<1>. This is same for the bank address signal ba<0:1> and the interrupt bank signal mcas9p<0:1>.

FIG. 2A is a schematic circuit diagram showing a first auto-precharge signal generator included in the auto-precharge signal generation unit 50 shown in FIG. 1.

As shown, the first auto-precharge signal generator includes a first auto-precharge signal output unit 51 for generating the first bit auto-precharge signal apcgp<0> in response to the first bit bank selection signal eya8p<0> and the single-bit address signal add<10>; a first synchronization unit 52 for passing an output signal of the first auto-precharge signal output unit 51 to a first delay unit 53 in response to the data access period termination signal ybst_end9p and a first bit interrupt bank signal mcas9p<0>; the first delay unit 53 for delaying an output signal of the first synchronization unit 52 for a predetermined delay time; and a ninth to a thirteenth inverters I9 to I13 for delaying and inverting an output signal of the first delay unit 53.

The first synchronization unit 52 includes a third NAND gate ND3 and a fourth NAND gate ND4. The third NAND gate ND3 performs a logic NAND operation to the data access period termination signal ybst_end9p and the first bit interrupt bank signal mcas9p<0>. Then, the fourth NAND gate ND4 performs a logic NAND operation to an output signal of the third NAND gate ND3 and an output signal of the first auto-precharge signal output unit 51.

The first auto-precharge signal output unit 51 includes a precharge detection unit 51A for determining whether or not the CAS pulse signal casp6 is inputted with a precharge command; an initialization unit 51B for initializing an output terminal of the precharge detection unit 51A; an output unit 51C for latching an output signal of the precharge detection unit 51A.

In detail, the precharge detection unit 51A includes a first NAND gate ND1, a first inverter I1, a first p-type metal oxide semiconductor (PMOS) transistor PM1, a first n-type metal oxide semiconductor (NMOS) transistor NM1 and a second NMOS transistor NM2. The first inverter I1 inverters the single-bit address signal add<10> and the first NAND gate ND1 receives an output signal of the first inverter I1 and the first bit bank selection signal eya8p<0>. The first PMOS transistor PM1 is connected between a power supply voltage and the first NMOS transistor NM1, and a gate of the first PMOS transistor PM1 receives an output signal of the first NAND gate ND1. The first and the second NMOS transistors NM1 and NM2 are connected in series between the first PMOS transistor PM1 and a ground voltage. A gate of the first NMOS transistor NM1 and a gate of the second NMOS transistor NM2 receive the first bit bank selection signal eya8p<0> and the single-bit address signal add<10>.

The initialization unit 51B includes a second PMOS transistor PM2, a third PMOS transistor PM3 and a rising edge detection unit 51D. The second and the third PMOS transistors PM2 and PM3 are connected in parallel between the power supply voltage and the output terminal of the precharge detection unit 51A. The rising edge detection unit 51D detects a rising edge of the first bit auto-precharge signal apcgp<0>. The third PMOS transistor PM3 supplies the power supply voltage to the output terminal of the precharge detection unit 51A in response to an output signal of the rising edge detection unit 51D.

The rising edge detection unit 51D includes a second to a fourth inverters I2 to I4 connected in series for delaying the first bit auto-prechrage signal apcgp<0> and a second NAND gate ND2 for receiving an output signal of the second inverter I2 and the first bit auto-precharge signal apcgp<0>.

The output unit 51C includes a fifth to an eighth inverters I5 to I8. The fifth and the sixth inverters I5 and I6 form a latch for latching the output signal of the precharge detection unit 51A. The seventh and the eighth inverters I7 and I8 delay an output signal of the latch formed by the fifth and the sixth inverters I5 and I6.

Referring to FIG. 2A, operations of the first auto-precharge signal generator are described below.

The precharge detection unit 51A generates its output signal in response to the single-bit address signal add<10> and the output unit 51C lathes the output signal of the precharge detection unit 51A. The first synchronization unit 52 controls the output signal of the first auto-precharge signal output unit 51 to be outputted as the first bit auto-precharge signal apcgp<0> passing through the first delay unit 53 and the ninth to the thirteenth inverters I9 to I13 when the data access period termination signal ybst_end9p is activated.

Meanwhile, if the first bit interrupt bank signal mcas9p<0> is activated while the data access period termination signal ybst_end9p is inactivated, the first synchronization unit 52 controls the first bit auto-precharge signal apcgp<0> to be generated.

FIG. 2B is a schematic circuit diagram showing a second auto-precharge signal generator included in the auto-precharge signal generation unit 50 shown in FIG. 1.

As shown, the second auto-precharge signal generator includes a second auto-precharge signal output unit 55 for generating a second bit auto-precharge signal apcgp<1> in response to the second bit bank selection signal eya8p<1> and the single-bit address signal add<10>; a second synchronization unit 56 for passing an output signal of the second auto-precharge signal output unit 55 to a second delay unit 57 in response to the data access period termination signal ybst_end9p and a second bit interrupt bank signal mcas9p<1>; the second delay unit 57 for delaying an output signal of the second synchronization unit 56 for a predetermined delay time; and a plurality of inverters connected in series for receiving an output signal of the second delay unit 57 to generate the second bit auto-precharge signal apcgp<1>.

Since the second auto-precharge signal generator has the same structures and operations with the first auto-precharge signal generator, detailed descriptions of the second auto-precharge signal generator are omitted.

Referring to FIGS. 1 to 2B, operations of the conventional auto-precharge control device are described below.

The bank signal generation unit 30 generates the bank selection signal eya8p<0:1> in response to the bank address signal ba<0:1> and the CAS pulse signal casp6. The data access period detection unit 40 activates the data access period signal ybst in response to the CAS pulse signal casp6. Then, the data access period detection unit 40 inactivates the data access period signal ybst in response to the bit line disable signal bl_dis. Thereafter, the data access period termination signal ybst_end9p is activated when the data access period signal ybst is inactivated so as to determine a generation timing of the auto-precharge signal apcgp<0:1>.

Thereafter, the auto-precharge signal generation unit 50 selectively inputs the auto-precharge signal apcgp<0:1> to the first and the second banks according to the bank selection signal eya8p<0:1> in response to the data access period termination signal ybst_end9p.

Meanwhile, the bank signal generation unit 30 also generates the interrupt bank signal mcas9p<0:1> and the auto-precharge signal generation unit 50 generates the auto-precharge signal apcgp<0:1> in response to the interrupt bank signal mcas9p<0:1>. In this case, the data access period termination signal ybst_end9p is in an inactivated state, and the interrupt bank signal mcas9p<0:1> is activated if a WRA command is newly inputted when operations according to a previous WRA command are not completed.

Meanwhile, according to the conventional auto-precharge control device, it is possible that a newly inputted WRA command is not stably performed if the newly inputted WRA is inputted right after a previous WRA command is performed.

FIG. 3 is a timing diagram showing operations of the conventional auto-precharge control device shown in FIG. 1.

Herein, it is assumed that a WRA command is inputted right after a previous WRA command is performed and a burst length is 4.

As shown, the CAS pulse signal casp6 is activated when the WRA command is inputted. Then, the data access period signal ybst is activated in response to the CAS pulse signal casp6. Herein, 'WRA<0>' shown in FIG. 3 means that the WRA command is inputted to the first bank. Thereafter, the data access period signal ybst is inactivated when a data input/output operation is completed, and the data access period termination signal ybst_end9p becomes a low pulse in response to the data access period signal ybst. Then, the first bit auto-precharge signal apcgp<0> is activated. At this time, i.e., if the WRA command is newly inputted when the data input/output operations is completed and the auto-precharge signal apcgp<0> is activated, the newly WRA command cannot be normally performed since operations of the newly WRA command are prevented by the auto-precharge operation according to the auto-precharge signal apcgp<0>.

The above-mentioned problem is the same for the RDA command. That is, if the RDA command is newly inputted right after a previous RDA command is performed in a same bank, the newly inputted RDA command cannot be stably performed.

Therefore, as above-mentioned, according to the conventional auto-precharge control device, the WRA command or the RDA command cannot be stably performed when the WRA command or the RDA command is inputted right after a previous WRA command or a previous RDA command is performed in a same bank.

SUMMARY OF INVENTION

It is, therefore, an object of the present invention to provide a semiconductor memory device capable of stably performing a write with auto-precharge (WRA) command or a read with auto-precharge command inputted right after a previous WRA command or a previous RDA command is performed.

In accordance with an aspect of the present invention, there is provided a semiconductor memory device having a plurality of banks for stably performing a write with auto-prechrage (WRA) command or a read with auto-precharge (RDA) command, including: a bank signal generation unit for generating an interrupt bank signal based on a bank address signal and a column address strobe (CAS) signal; a data access period detection unit for generating a data access period signal based on the CAS signal and a bit line disable signal; and a masking signal generation unit for generating a masking signal in order to controlling a logic level of an auto-precharge signal based on the data access period signal and the interrupt bank signal.

BRIEF DESCRIPTION OF THE DRAWINGS

The above and other objects and features of the present invention will become apparent from the following description of preferred embodiments taken in conjunction with the accompanying drawings, in which:

FIG. 2A is a schematic circuit diagram showing a first auto-precharge signal generator included in an auto-precharge signal generation unit shown in FIG. 1;

FIG. 2B is a schematic circuit diagram showing a second auto-precharge signal generator included in the auto-precharge signal generation unit shown in FIG. 1;

DETAILED DESCRIPTION OF INVENTION

Hereinafter, a semiconductor memory device in accordance with the present invention will be described in detail referring to the accompanying drawings.

Figure 1:
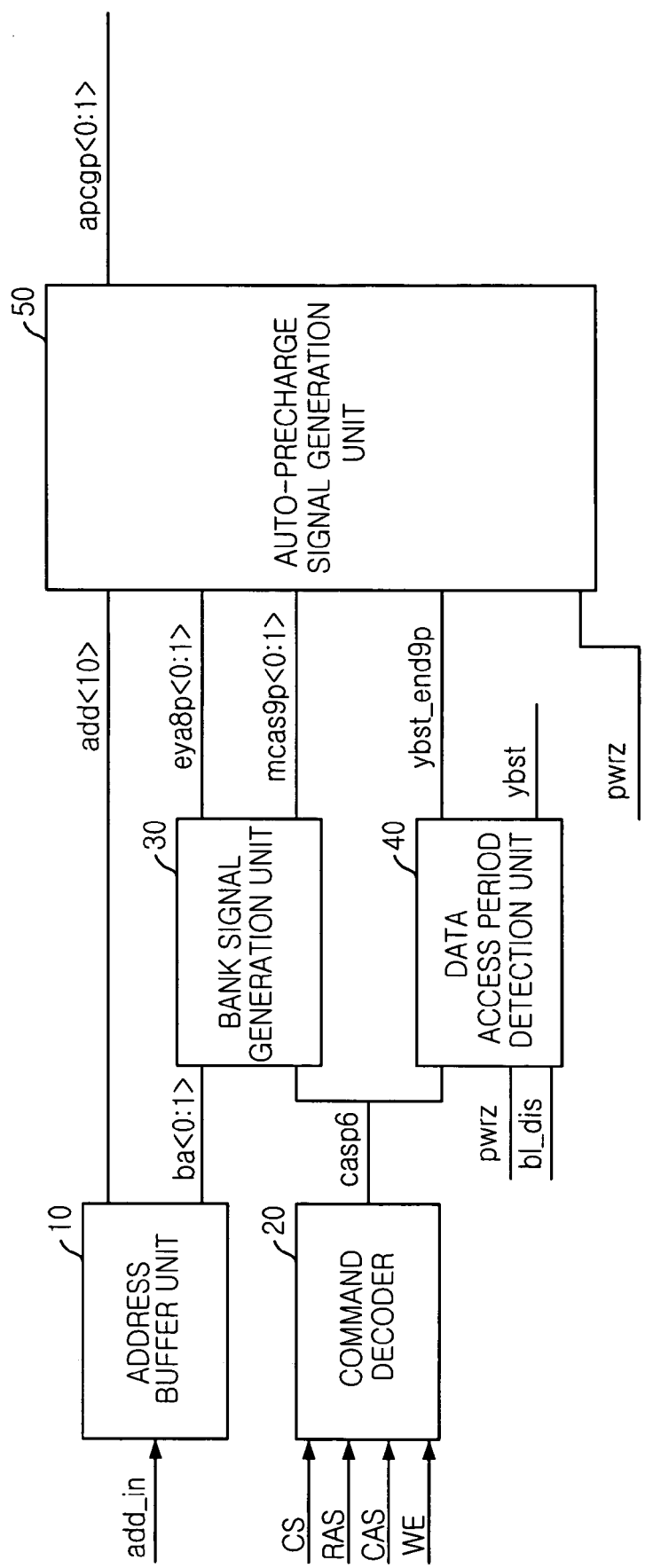
FIG. 1 is a block diagram showing a conventional auto-precharge control device included in a conventional DRAM.
Figure 3:
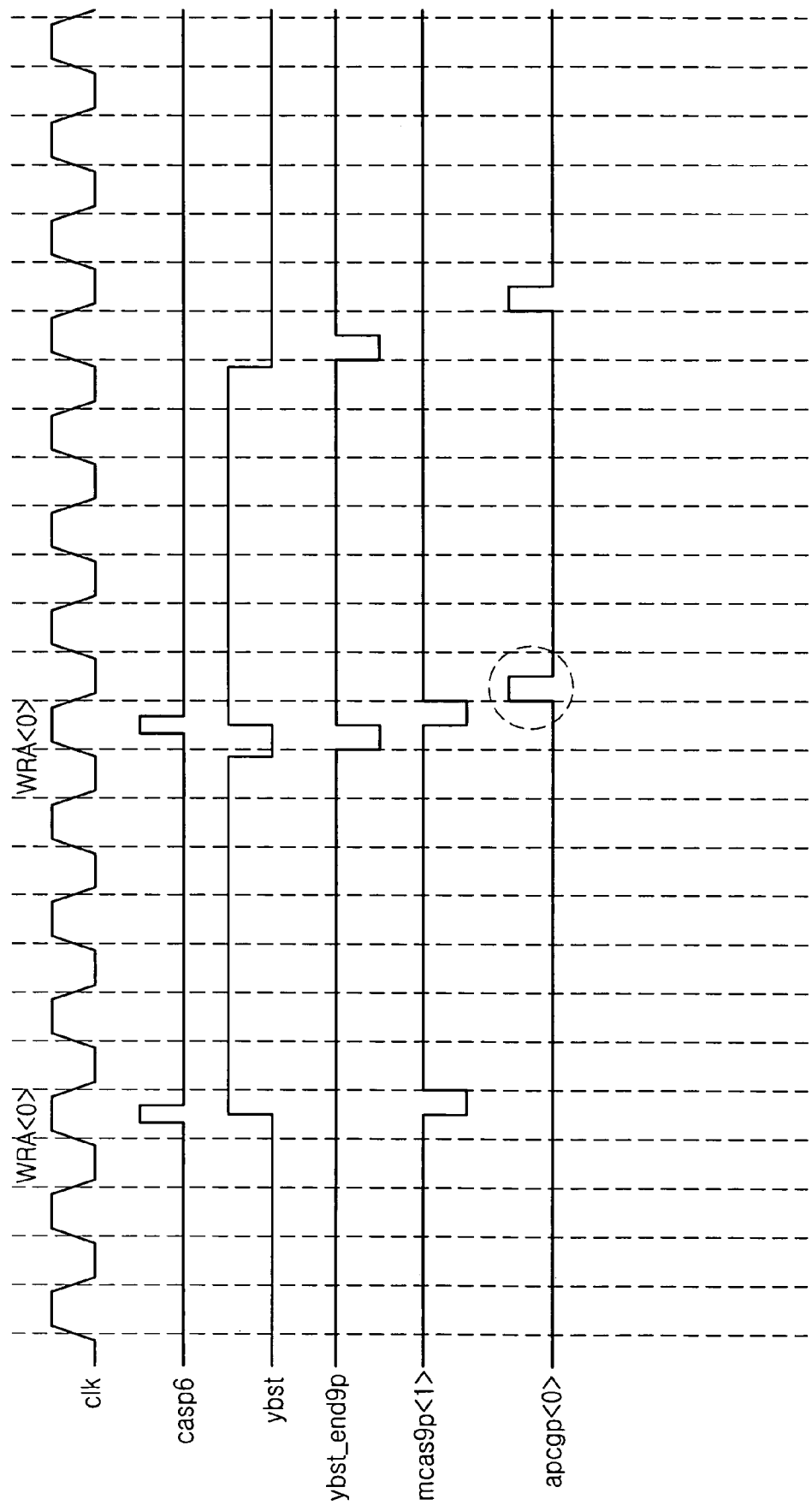
FIG. 3 is a timing diagram showing operations of the conventional auto-precharge control device shown in FIG. 1.
Figure 4:
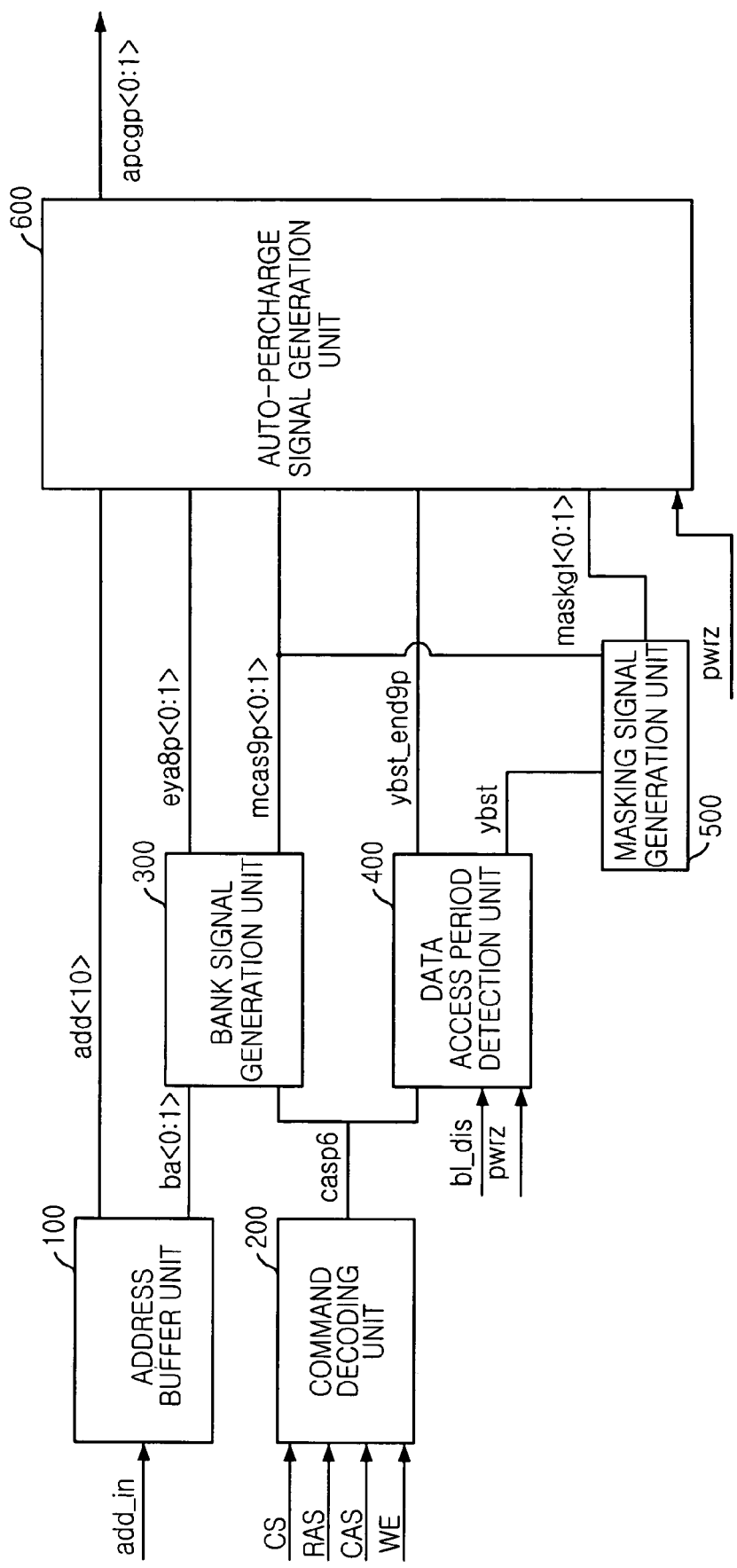
FIG. 4 is a block diagram showing an auto-precharge control device for use in a semiconductor memory device in accordance with a preferred embodiment of the present invention.

FIG. 4 is a block diagram showing an auto-precharge control device for use in a semiconductor memory device in accordance with a preferred embodiment of the present invention.

As shown, the auto-precharge control device includes an address buffer unit 100, a command decoding unit 200, a bank signal generation unit 300, a data access period detection unit 400, a masking signal generation unit 500 an auto-precharge signal generation unit 600.

The address buffer unit 100 receives an address signal add_in to generate a bank address signal ba<0:1> and a single-bit address signal add<10>. The command decoding unit 200 decodes a plurality of external command signals, i.e., a chip selection signal CS, a row address strobe signal RAS, a column address strobe signal CAS and a write enable signal WE in order to generate a CAS pulse signal casp6. The bank signal generation unit 300 generates a bank selection signal eya8p<0:1> and an interrupt bank signal mcas9p<0:1> based on the bank address signal ba<0:1> and the CAS pulse signal casp6.

The data access period detection unit 400 receives the CAS pulse signal casp6, a power-up signal pwrz, and a bit line disable signal bl_dis in order to generate a data access period termination signal ybst_end9p and a data access period signal ybst. The masking signal generation unit 500 generates a masking signal maskgl<0:1> based on the data access period signal ybst and the interrupt bank signal mcas9p<0:1>. The auto-precharge generation unit 600 generates an auto-precharge signal apcgp<0:1> in response to the bank selection signal eya8p<0:1> when the data access period termination signal ybst_end9p is activated. However, when the masking signal maskgl<0:1> is activated, the auto-precharge generation unit 600 does not generate the auto-precharge signal apcgp<0:1>.

In comparison with the conventional auto-precharge control device, the auto-precharge control device further includes the masking signal generation unit 500. That is, if a write with auto-precharge (WRA) command is inputted right after operations of a previous WRA command are completed, the masking signal generation unit 500 generates the masking signal maskgl<0:1> in order to prevents the auto-precharge signal apcgp<0:1> from being generated.

Accordingly, since an auto-precharge operation according to a previous WRA command is not performed, a following WRA command can be stably performed.

Figure 5:
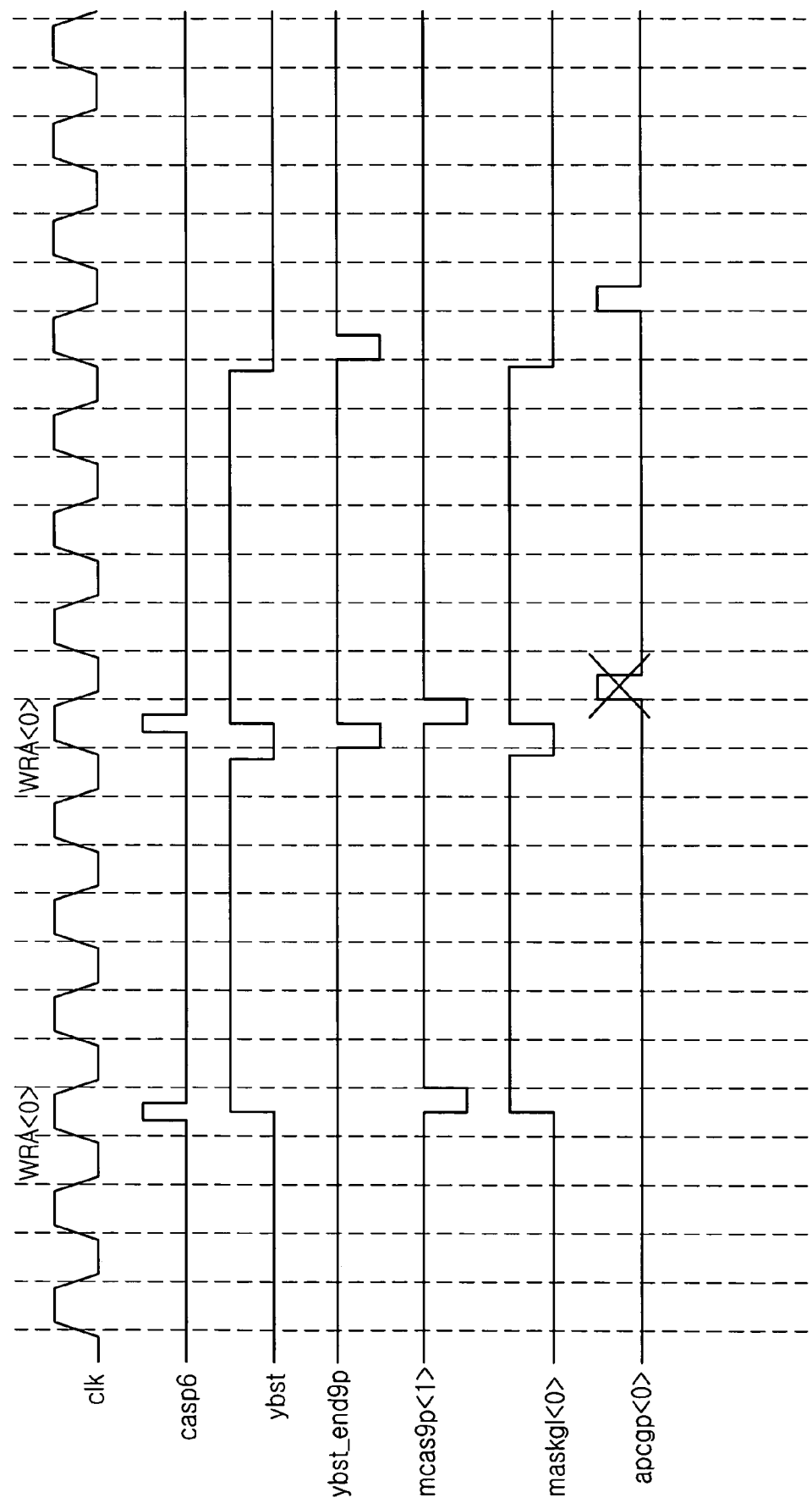
FIG. 5 is a timing diagram showing operations of the auto-precharge control device shown in FIG. 4.

FIG. 5 is a timing diagram showing operations of the auto-precharge control device shown in FIG. 4.

As shown, two WRA commands are successively inputted in synchronization with a clock signal clk in a same bank, i.e., a following WRA command is inputted right after a previous WRA command is performed. Herein, it is assumed that the semiconductor memory device includes two banks, i.e., a first bank having a bank number of 0 and a second bank having a bank number of 1 and the operations shown in FIG. 5 are performed in the first bank.

In detail, the command decoding unit 200 activates the CAS pulse signal casp6 in response to the previous WRA command. Then, the data access period detection unit 400 activates the data access period signal ybst in response to the CAS pulse signal casp6, and the bank signal generation unit 300 generates a first bit bank selection signal eya8p<0> and a second bit interrupt bank signal mcas9p<1> based on the bank address signal ba<0:1> and the CAS pulse signal casp6.

Thereafter, the data access period detection unit 400 inactivates the data access period signal ybst in response to the bit line disable signal bl_dis, whereby the data access period termination signal ybst_end9p becomes a low pulse in response to the data access period signal ybst.

Thereafter, when the following WRA command is inputted, the CAS pulse signal casp6 is activated. Then, in response to the CAS pulse signal casp6, the data access period signal ybst, the first bit bank selection signal eya8p<0> and the second bit interrupt bank signal mcas9p<1> are activated.

The masking signal generation unit 500 detects that the second bit interrupt bank signal mcas9p<1> is activated when the data access period signal ybst is activated, whereby the masking signal generation unit 500 activates a first bit masking signal maskgl<0>. Therefore, the first bit auto-precharge signal apcgp<0> cannot be activated because of the first bit masking signal maskgl<0>. Accordingly, the auto-precharge operation, which is should be performed after the data access operation according to the WRA command is completed, is not performed. As a result, the following WRA command can be stably performed not being hindered by the auto-precharge operation.

Figure 6:
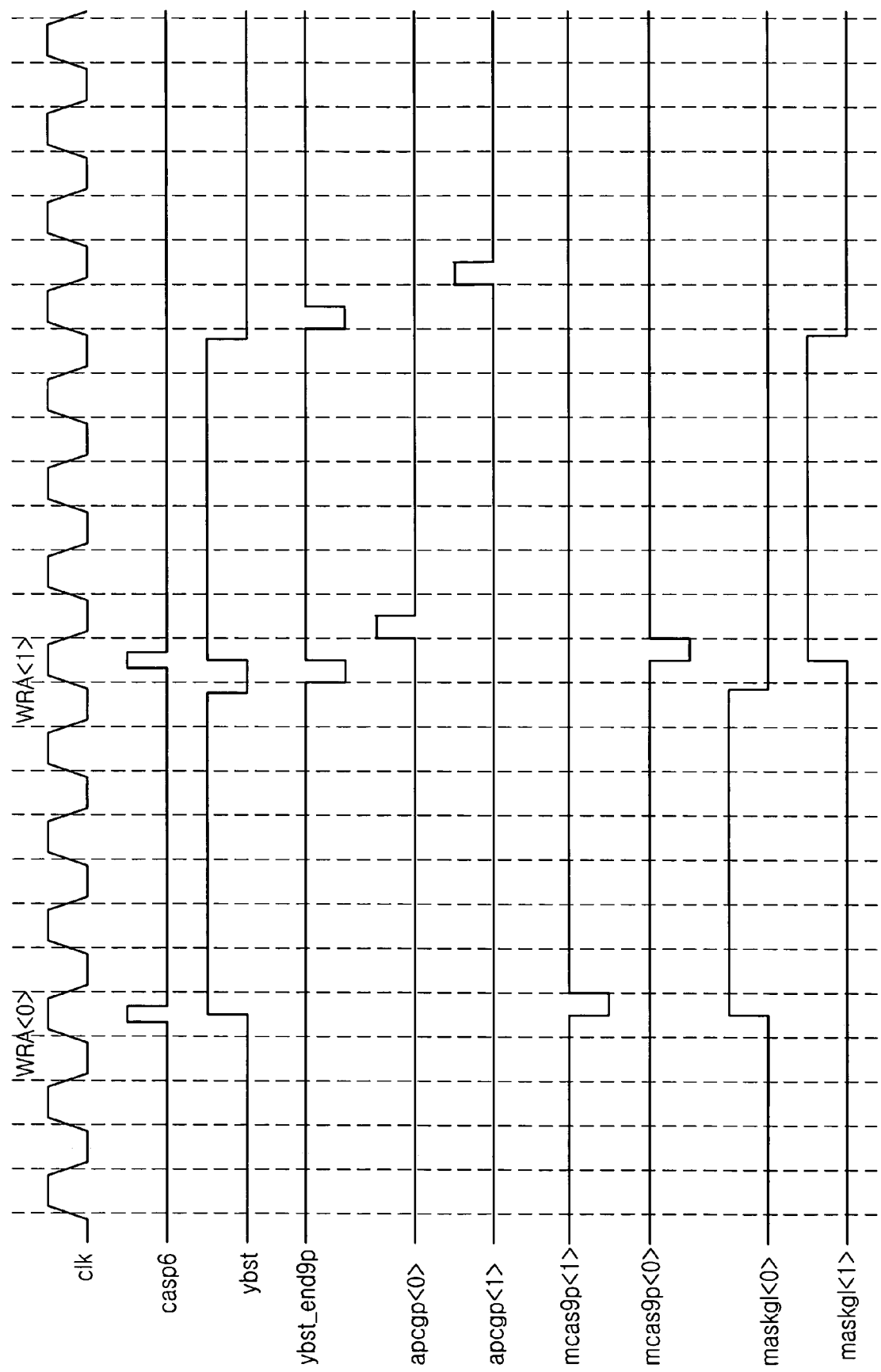
FIG. 6 is another timing diagram showing operations of the auto-precharge control device shown in FIG. 4.

FIG. 6 is another timing diagram showing operations of the auto-precharge control device shown in FIG. 4. Herein, in comparison with FIG. 5, FIG. 6 shows that two WRA commands are successively inputted to different banks, i.e., a previous WRA command is inputted to the first bank and a following WRA command is inputted to the second bank.

As shown, in each bank, operations according to the previous WRA command and the following command are normally performed. It is also shown that each auto-precharge operation of the first and the second bank is normally performed since WRA commands are not successively inputted in a same bank.

Figure 7:
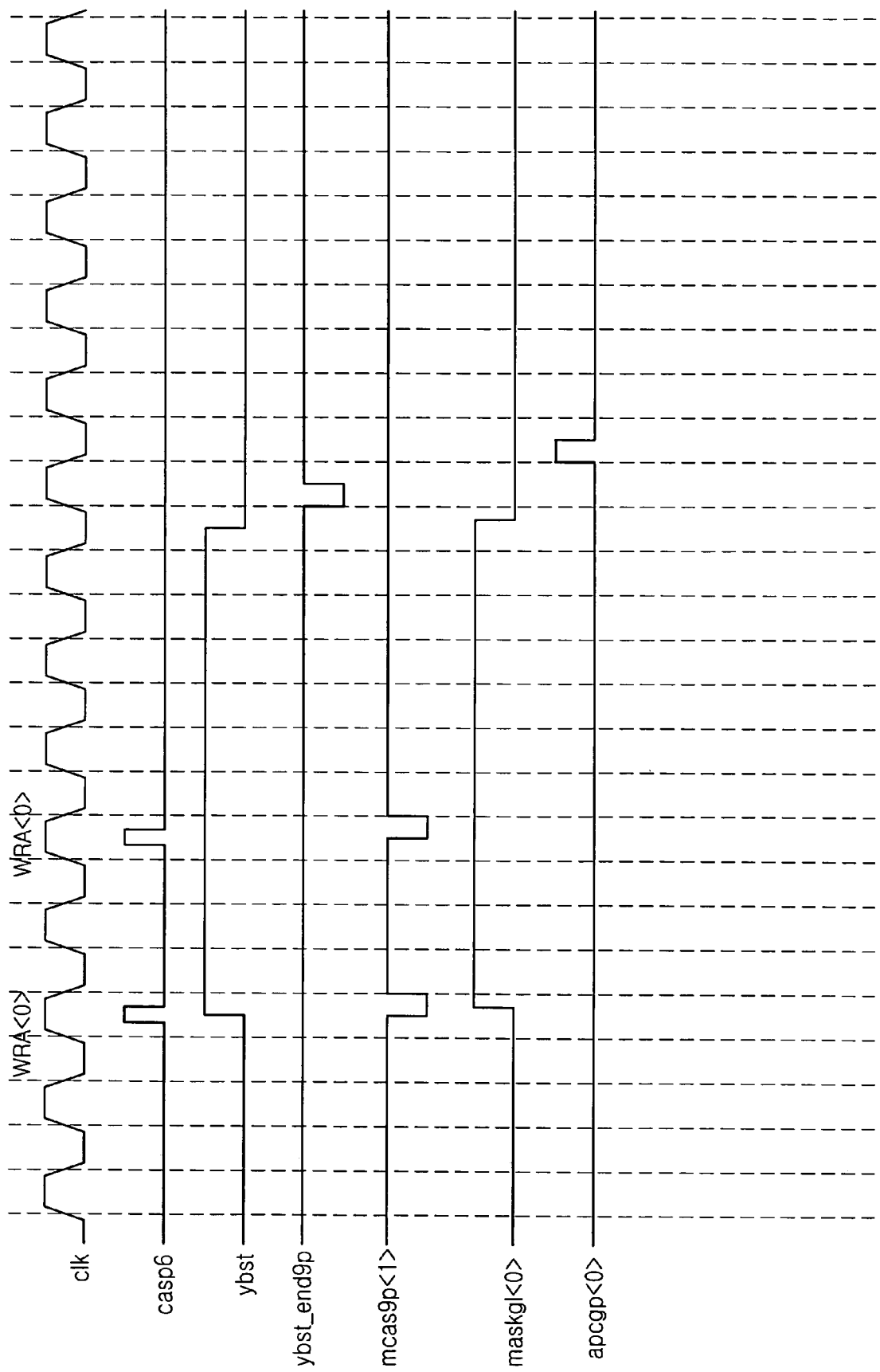
FIG. 7 is further another timing diagram showing operations of the auto-precharge control device shown in FIG. 4.

FIG. 7 is further another timing diagram showing operations of the auto-precharge control device shown in FIG. 4. Herein, FIG. 7 shows that a following WRA command is inputted during performing a previous WRA command in a same bank.

The command decoding unit 200 activates the CAS pulse signal casp6 in response to the previous WRA command inputted to the first bank. Then, the data access period detection unit 400 activates the data access period signal ybst in response to the CAS pulse signal casp6. Thereafter, the following WRA command is inputted while the data access period signal ybst is activated. Sine the following WRA command is inputted to the same bank, i.e., the first bank, the data access period signal ybst keeps its activation state until the bit line disable signal bl_dis according to the following WRA command is activated.

Thereafter, when the data access period signal ybst is inactivated, the data access period termination signal ybst_end9p becomes a low pulse. Then, the first bit auto-precharge signal apcgp<0> is activated in response to the data access period termination signal ybst_end9p in order to perform the auto-precharge operation.

Therefore, in this case, operations of the masking signal generation unit 500 do not hinder the previous and the following WRA commands from being normally performed.

Figure 8:
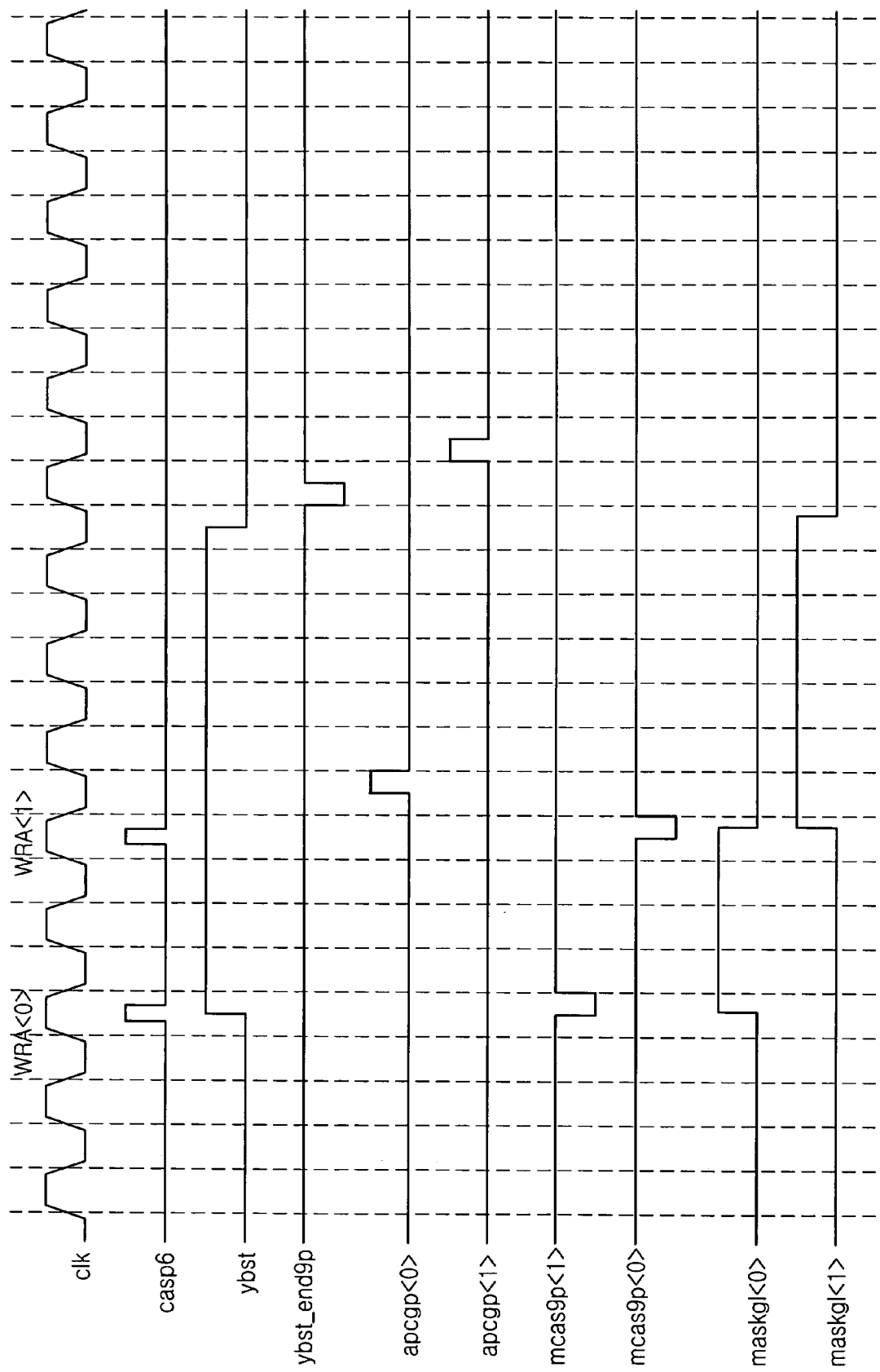
FIG. 8 is further another timing diagram showing operations of the auto-precharge control device shown in FIG. 4.

FIG. 8 is further another timing diagram showing operations of the auto-precharge control device shown in FIG. 4.

Herein, FIG. 8 shows a previous WRA command is inputted to the first bank and a following WRA command is inputted to the second bank during performing the previous WRA command.

As shown, each operation of the previous WRA command and the following WRA command is normally performed in the first bank and the second bank respectively.

Figure 9A:
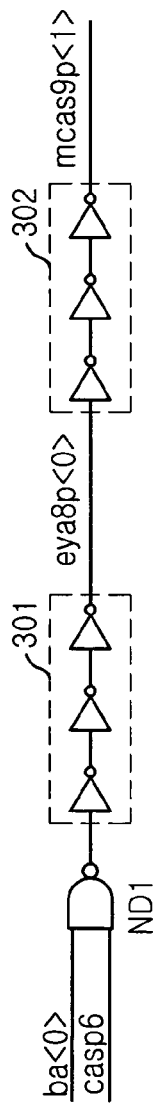
FIG. 9A is a schematic circuit diagram showing a first bank signal generator included in a bank signal generation unit shown in FIG. 4.

FIG. 9A is a schematic circuit diagram showing a first bank signal generator included in the bank signal generation unit 300 shown in FIG. 4.

As shown, the first bank signal generator includes a first NAND gate ND1, a first inverter unit 301 and a second inverter unit 302.

The first NAND gate ND1 receives a first bit bank address signal ba<0> and the CAS pulse signal casp6. The first inverter unit 310 includes a plurality of inverters connected in series for delaying and inverting an output signal of the first NAND gate ND1 to thereby generate the first bit bank selection signal eya8p<0>. The second inverter unit 302 includes a plurality of inverters connected in series for delaying and inverting the first bit bank selection signal eya8p<0> to thereby generate the second bit interrupt bank signal mcas9p<1>.

Figure 9B:
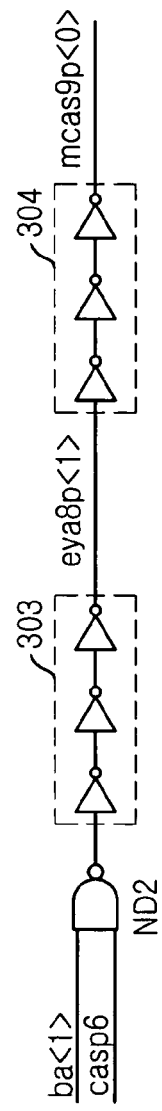
FIG. 9B is a schematic circuit diagram showing a second bank signal generator included in the bank signal generation unit shown in FIG. 4.

FIG. 9B is a schematic circuit diagram showing a second bank signal generator included in the bank signal generation unit 300 shown in FIG. 4.

As shown, the second bank signal generator includes a second NAND gate ND2, a third inverter unit 303 and a fourth inverter unit 304.

Since the second bank signal generator has the same structure and operation with the first bank signal generator, detailed descriptions of the second bank signal generator are omitted. Herein, the number of the bank signal generators included in the bank signal generation unit 300 is the same to the number of banks included in the semiconductor memory device.

Figure 10:
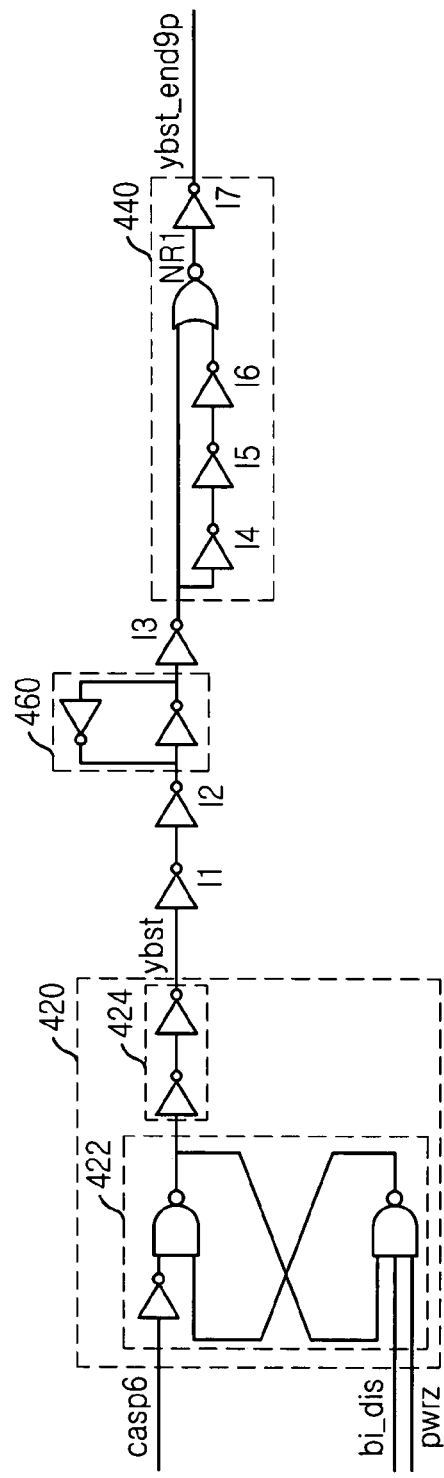
FIG. 10 is a schematic circuit diagram showing a data access detection unit shown in FIG. 4.

FIG. 10 is a schematic circuit diagram showing the data access detection unit 400 shown in FIG. 4.

As shown, the data access detection unit 400 includes a data access period signal generator 420 for activating the data access period signal ybst when the CAS pulse signal casp6 is activated and for inactivating the data access period signal ybst in response to the bit line disable signal bl_dis and the power-up signal pwrz; a first and a second inverters I1 and I2 for delaying the data access period signal ybst; a latch 460 for latching an output signal of the second inverter I2; a third inverter I3 for inverting an output signal of the latch 460; and a falling edge detector 440 for generating the data access period termination signal ybst_end9p by detecting a falling edge of the data access period signal ybst.

In detail, the data access period signal generator 420 includes an RS flip-flop 422 for receiving the CAS pulse signal casp6 as a set signal and for receiving the bit line disable signal bl_dis and the power-up signal pwrz as a reset signal; and a fifth inverter unit for delaying an output signal of the RS flip-flop 420 to thereby generate the data access period signal ybst. Herein, the RS flip-flop 420 is formed by cross-coupled NAND gates.

The falling edge detector 440 includes a fourth to a sixth inverters I4 to I6 connected in series for delaying and inverting an output signal of the third inverter I3; a NOR gate NR1 for receiving the output signal of the third inverter I3 and an output signal of the sixth inverter I6; and a seventh inverter I7 for inverting an output signal of the NOR gate NR1 in order to generate the data access period termination signal ybst_end9p.

Operations of the data access detection unit 400 are described below.

The data access period signal generator 420 activates the data access period signal ybst if the CAS pulse signal casp6 is activated when the power-up signal pwrz is activated. Thereafter, the data access period signal generator 420 inactivates the data access period signal ybst in response to the bit line disable signal bl_dis. The data access period termination signal ybst_end9p is generated when the data access period signal ybst is inactivated. The data access period termination signal ybst_end9p is used for indicating a timing of starting the auto-precharge operation.

Figure 11A:
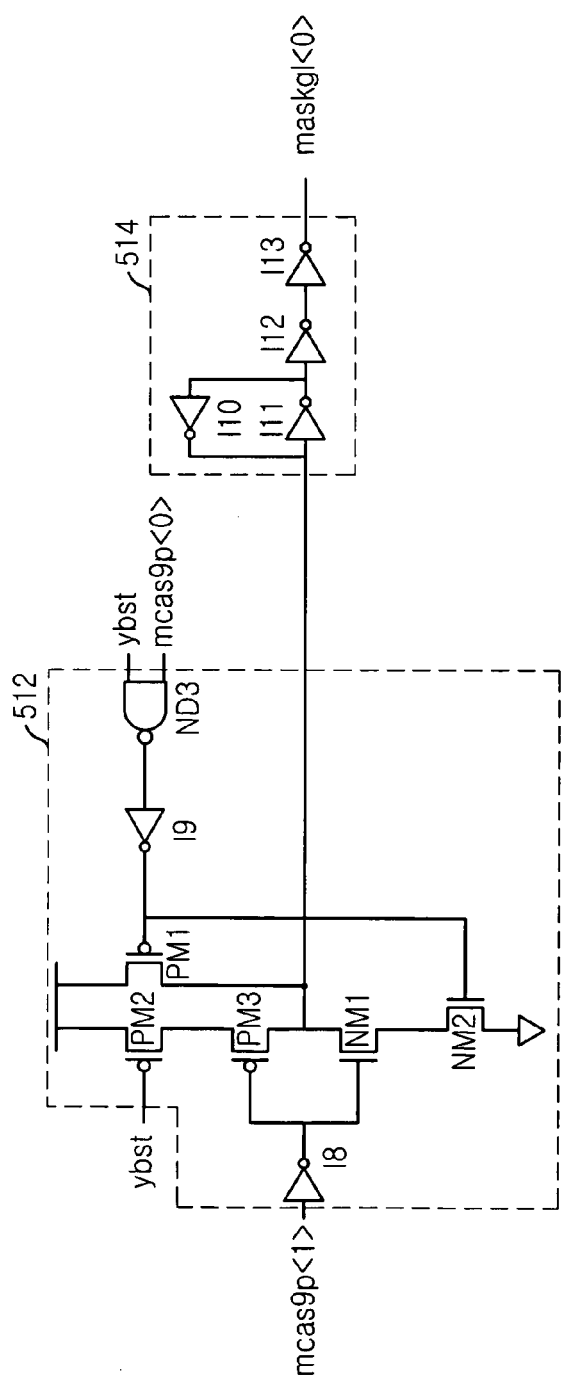
FIG. 11A is a schematic circuit diagram showing a first masking signal generator included in a masking signal generation unit shown in FIG. 4.

FIG. 11A is a schematic circuit diagram showing a first masking signal generator included in the masking signal generation unit 500 shown in FIG. 4.

As shown, the first masking signal generator includes a first signal generator 512 for generating the first bit masking signal maskgl<0> based on the data access period signal ybst and the interrupt bank signal mcas9p<0:1>; and a first output unit 514 for latching and delaying an output signal of the signal generator 512 in order to output the first bit masking signal maskgl<0>.

The first signal generator includes a first to a third p-type metal oxide semiconductor (PMOS) transistors PM1 to PM3, a first and a second n-type metal oxide semiconductor (NMOS) transistors NM1 and NM2, an eighth and a ninth inverters I8 and I9 and a third NAND gate ND3.

The third NAND gate ND3 receives the data access period signal ybst and the first bit interrupt bank signal mcas9p<0>, and the ninth inverter I9 inverts an output signal of the third NAND gate ND3. The first PMOS transistor PM1 is connected between a power supply voltage and the first NMOS transistor NM1, and a gate of the first PMOS transistor PM1 receives an output signal of the ninth inverter I9. The second PMOS transistor PM2 whose gate receives the data access period signal ybst is connected between the power supply voltage and the third PMOS transistor PM3. The eighth inverter I8 inverts the second bit interrupt bank signal mcas9p<1>, and each gate of the first NMOS transistor NM1 and the third PMOS transistor PM3 receives an output signal of the eighth inverter I8. The first and the second inverters NM1 and NM2 are connected in series between the third PMOS transistor PM3 and a ground voltage.

The first output unit 514 includes a tenth and an eleventh inverters I10 and I11 forming a latch for latching an output signal of the signal generator 512; and a twelfth and a thirteenth inverters I12 and I13 connected in series for delaying an output signal of the eleventh inverter I11 in order to output the first bit masking signal maskgl<0>.

Figure 11B:
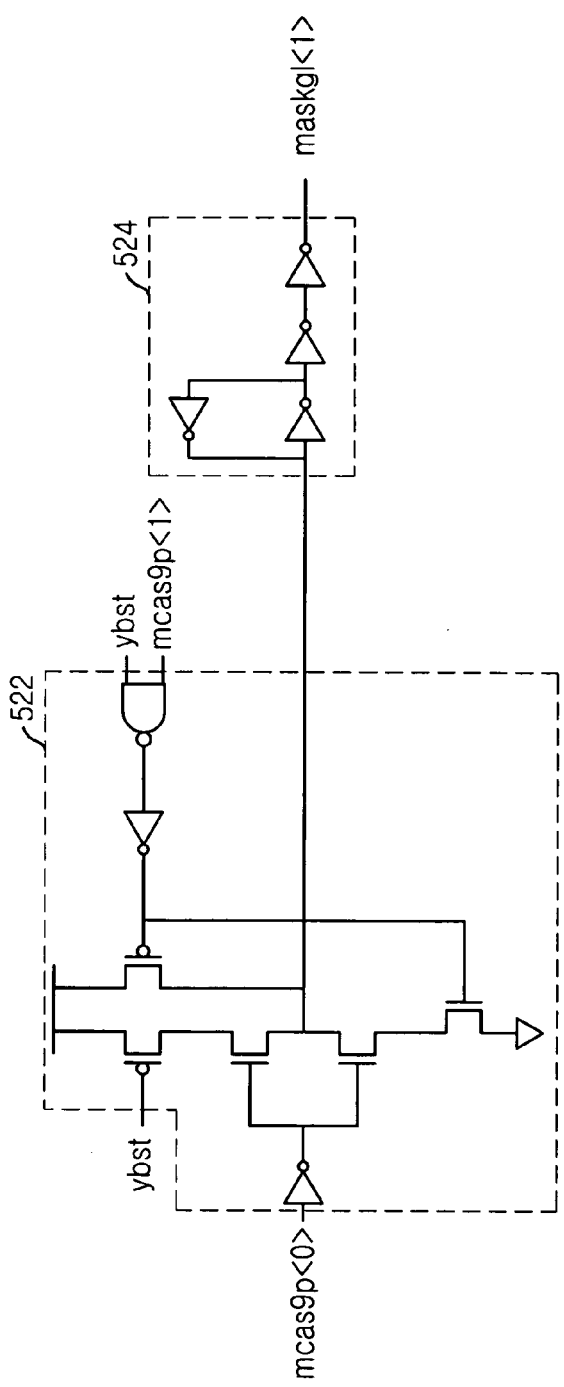
FIG. 11B is a schematic circuit diagram showing a second masking signal generator included in the masking signal generation unit shown in FIG. 4.

FIG. 11B is a schematic circuit diagram showing a second masking signal generator included in the masking signal generation unit 500 shown in FIG. 4.

As shown, the second masking signal generator includes a second signal generator 512 and a second output unit 514.

Since the second masking signal generator has the same structure and operations with the first making signal generator, detailed descriptions of the second masking signal generator are omitted.

Figure 12A:
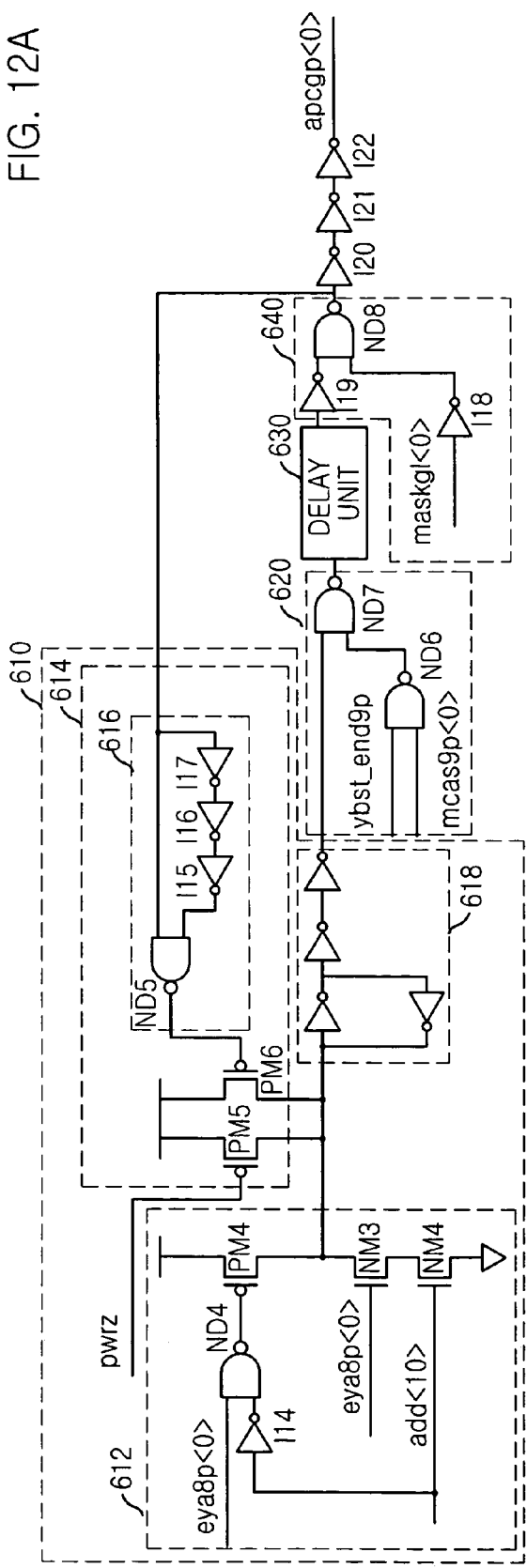
FIG. 12A is a schematic circuit diagram showing a first auto-precharge signal generator included in an auto-precharge signal generation unit shown in FIG. 4.

FIG. 12A is a schematic circuit diagram showing a first auto-precharge signal generator included in the auto-precharge signal generation unit 600 shown in FIG. 4.

As shown, the first auto-precharge signal generator includes a first auto-precharge signal output unit 610 for generating the first bit auto-precharge signal apcgp<0> based on the first bit bank selection signal eya8p<0> and the single-bit address signal add<10>; a first synchronization unit 620 for passing an output signal of the first auto-precharge signal output unit 610 to a first delay unit 630 in response to the data access period termination signal ybst_end9p and the first bit interrupt bank signal mcas9p<0>; the first delay unit 630 for delaying an output signal of the first synchronization unit 620 for a predetermined delay time; a masking unit 640 for preventing the first bit auto-precharge signal apcgp<0> from being activated in response to the first bit masking signal maskgl<0>; and a twentieth to a twenty second inverters I20 to I22 for delaying and inverting an output signal of the masking unit 640 in order to generate the first bit auto-precharge signal apcgp<0>.

The first synchronization unit 620 includes a sixth NAND gate ND6 and a seventh NAND gate ND7. The sixth NAND gate ND6 performs a logic NAND operation to the data access period termination signal ybst_end9p and the first bit interrupt bank signal mcas9p<0>. Then, the seventh NAND gate ND7 performs a logic NAND operation to an output signal of the sixth NAND gate ND6 and an output signal of the first auto-precharge signal output unit 610.

The masking unit 640 includes an eighteenth inverter I18 for inverting the first bit masking signal maskgl<0>; a nineteenth inverter I19 for inverting an output signal of the first delay unit 630; and an eighth NAND gate for receiving output signals of the eighteenth and the nineteenth inverters I18 and I19.

The first auto-precharge signal output unit 610 includes a precharge detection unit 612 for receiving the first bank selection signal eya8p<0> and the single-bit address add<10>; an initialization unit 614 for initializing an output terminal of the precharge detection unit 612; a signal output unit 618 for latching an output signal of the precharge detection unit 612.

In detail, the precharge detection unit 612 includes a fourth NAND gate ND4, a fourteenth inverter I14, a fourth PMOS transistor PM4, a third NMOS transistor NM3 and a fourth NMOS transistor NM4. The fourteenth inverter I14 inverters the single-bit address signal add<10> and the fourth NAND gate ND4 receives an output signal of the fourteenth inverter I14 and the first bit bank selection signal eya8p<0>. The fourth PMOS transistor PM4 is connected between the power supply voltage and the third NMOS transistor NM3, and a gate of the fourth PMOS transistor PM4 receives an output signal of the fourth NAND gate ND4. The third and the fourth NMOS transistors NM3 and NM4 are connected in series between the fourth PMOS transistor PM4 and the ground voltage. A gate of the third NMOS transistor NM3 and a gate of the fourth NMOS transistor NM4 receive the first bit bank selection signal eya8p<0> and the single-bit address signal add<10>.

The initialization unit 614 includes a fifth PMOS transistor PM5, a sixth PMOS transistor PM6 and a rising edge detection unit 616. The fifth and the sixth PMOS transistors PM5 and PM6 are connected in parallel between the power supply voltage and the output terminal of the precharge detection unit 612. The rising edge detection unit 616 detects a rising edge of the first bit auto-precharge signal apcgp<0>. The sixth PMOS transistor PM6 supplies the power supply voltage to the output terminal of the precharge detection unit 612 in response to an output signal of the rising edge detection unit 616.

The rising edge detection unit 616 includes a fifteenth to a seventeenth inverters I15 to I17 connected in series for delaying the first bit auto-prechrage signal apcgp<0> and a fifth NAND gate ND5 for receiving an output signal of the fifteenth inverter I15 and the first bit auto-precharge signal apcgp<0>.

The signal output unit 618 includes a plurality of inverters for latching and delaying an output signal of the precharge detection unit 612.

Figure 12B:
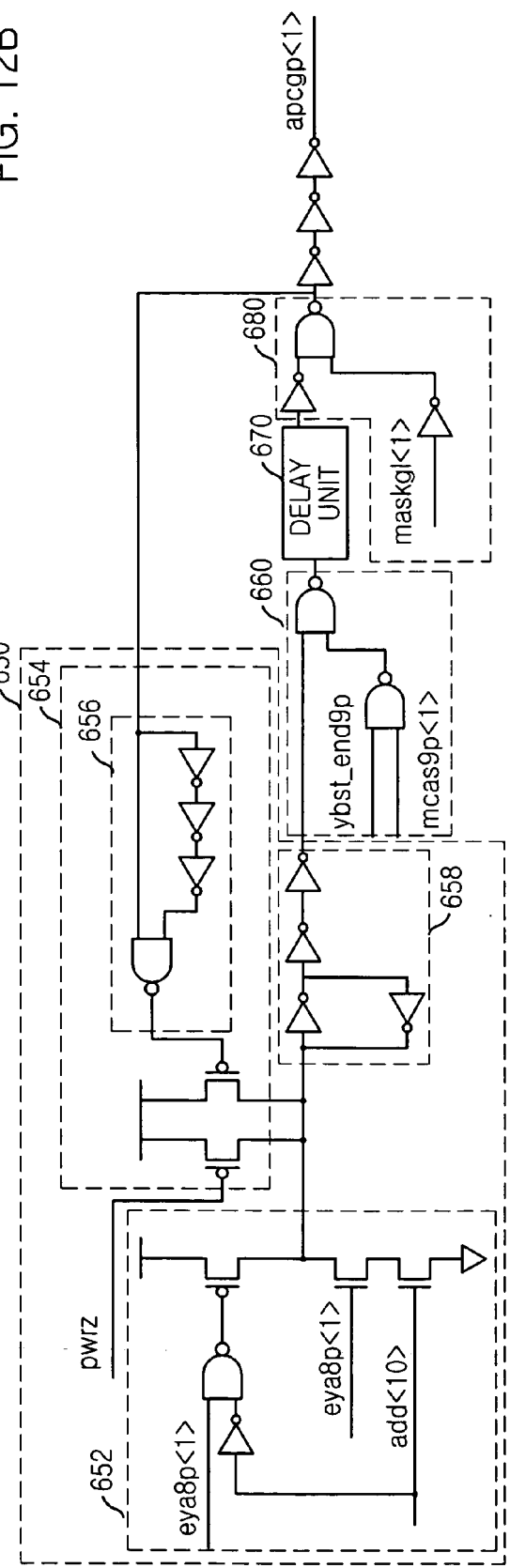
FIG. 12B is a schematic circuit diagram showing a second auto-precharge signal generator included in the auto-precharge signal generation unit shown in FIG. 4.

FIG. 12B is a schematic circuit diagram showing a second auto-precharge signal generator included in the auto-precharge signal generation unit 600 shown in FIG. 4.

As shown, the second auto-precharge signal generator includes a second auto-precharge signal output unit 650, a second synchronization unit 660; the second delay unit 670, a masking unit 680 and a plurality of inverters connected in series.

Since the second auto-precharge signal generator has the same structure and operations with the first auto-precharge signal generator, detailed descriptions of the second auto-precharge signal generator are omitted.

Although the above-mentioned operations of the auto-precharge control device are described considering only a WRA command, the above-mentioned operations are the same for a read with auto-precharge (RDA) command.

Therefore, in accordance with the present invention, a semiconductor memory device can stably perform a WRA command or an RDA command even though the WRA command or the RDA command is inputted right after a previous WRA command or a previous RDA command is performed in a same bank.

The present application contains subject matter related to Korean patent application No. 2003-99699, filed in the Korean Patent Office on Dec. 30, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device having a plurality of banks for stably performing a write with auto-prechrage (WRA) command or a read with auto-precharge (RDA) command, comprising:
   a bank signal generation unit for generating an interrupt bank signal based on a bank address signal and a column address strobe (CAS) signal;
   a data access period detection unit for generating a data access period signal based on the CAS signal and a bit line disable signal; and
   a masking signal generation unit for generating a masking signal in order to controlling a logic level of an auto-precharge signal based on the data access period signal and the interrupt bank signal.

2. The semiconductor memory device as recited in claim 1, wherein the masking signal prevents the auto-precharge signal from being activated when a data access operation is performed according to the WRA command or the RDA command.

3. The semiconductor memory device as recited in claim 2, wherein the bank signal generation unit further generates a bank selection signal for selecting one of the plurality of banks based on the bank address signal and the CAS signal.

4. The semiconductor memory device as recited in claim 3, wherein the data access period detection unit further generates a data access period signal activated when the data access operations is performed based on the CAS signal and the bit line disable signal.

5. The semiconductor memory device as recited in claim 4, further comprising:
   an auto-precharge signal generation unit for generating the auto-precharge signal based on the bank selection signal, the interrupt bank signal, the data access period termination signal, the masking signal and a single-bit address signal.

6. The semiconductor memory device as recited in claim 5, further comprising:
   an address buffer unit for generating the single-bit address signal and the bank address signal based on an input address signal; and
   a command decoding unit for generating the CAS signal based on a plurality of command signals.

7. The semiconductor memory device as recited in claim 6, wherein the bank signal generation unit includes a plurality of bank signal generators each of which including:
   a NAND gate for receiving the bank address signal and the CAS signal;
   a first inverter unit including a plurality of inverters for delaying and inverting an output signal of the NAND gate to thereby generate the bank selection signal; and
   a second inverter unit including a plurality of inverters for delaying and inverting the bank selection signal to thereby generate the interrupt bank signal.

8. The semiconductor memory device as recited in claim 7, wherein the number of the plurality of bank signal generators and the number of the plurality of banks are the same.

9. The semiconductor memory device as recited in claim 6, wherein the data access period detection unit includes:
   a data access period signal generator for generating the data access period signal based on the CAS signal, the bit line disable signal and a power-up signal; and
   a falling edge detector for detecting a falling edge of the data access period signal to thereby generate the data access period termination signal.

10. The semiconductor memory device as recited in claim 9, wherein the data access period signal generator activates the data access period signal when the CAS signal is activated and inactivates the data access period signal in response to the bit line disable signal and the power-up signal.

11. The semiconductor memory device as recited in claim 10, wherein the data access period signal generator includes:
    an RS flip-flop for receiving the CAS signal as a set signal and for receiving the bit line disable signal and the power-up signal as a reset signal; and
    a plurality of inverters connected in series for delaying an output signal of the RS flip-flop to thereby generate the data access period signal.

12. The semiconductor memory device as recited in claim 11, wherein the RS flip-flop is formed by cross-coupled NAND gates.

13. The semiconductor memory device as recited in claim 12, wherein the falling edge detector includes:
    an inverter unit having a plurality of inverters connected in series for receiving the data access period signal;
    a NOR gate for receiving the data access period signal and an output signal of the third inverter unit; and
    an inverter for inverting an output signal of the NOR gate to thereby generate the data access period termination signal.

14. The semiconductor memory device as recited in claim 6, wherein the masking signal generation unit includes a plurality of masking signal generators each of which including:
    a signal generator for generating the masking signal based on the data access period signal and the interrupt bank signal; and
    an output unit for delaying an output signal of the signal generator to thereby output the masking signal.

15. The semiconductor memory device as recited in claim, 14, wherein the number of the plurality of masking signal generators and the number of the plurality of banks are the same.

16. The semiconductor memory device as recited in claim 15, wherein the signal generator includes:
    a NAND gate for receiving the data access period signal and a first bit of the interrupt bank signal;
    a first inverter for inverting an output signal of the NAND gate;
    a first p-type metal oxide semiconductor (PMOS) transistor connected between a power supply voltage and an output terminal receiving an output signal of the first inverter through a gate of the first PMOS transistor;
    a second PMOS transistor for receiving the data access period signal through a gate of the second PMOS transistor;
    a second inverter for inverting a second bit of the interrupt bank signal;
    a third PMOS transistor for receiving an output signal of the second inverter through a gate of the third PMOS transistor;
    a first n-type metal oxide semiconductor (NMOS) transistor NM1 for receiving the output signal of the second inverter through a gate of the first NMOS transistor; and a second NMOS transistor connected between the first NMOS transistor and a ground voltage receiving the output signal of the first inverter through a gate of the second NMOS transistor.

17. The semiconductor memory device as recited in claim 16, wherein the output unit includes:
    a third inverter and a fourth inverter forming a latch for latching an output signal of the signal generator; and
    a fifth inverter and a sixth inverter for delaying an output signal of the latch to thereby generate the masking signal.

18. The semiconductor memory device as recited in claim 6, wherein the auto-precharge signal generation unit includes a plurality of auto-precharge signal generators each of which including:
    an auto-precharge signal output unit for generating the auto-precharge signal based on the bank selection signal and the single-bit address signal;
    a synchronization unit for passing an output signal of the auto-precharge signal output unit in response to the data access period termination signal and the interrupt bank signal;
    a delay unit for delaying an output signal of the synchronization unit for a predetermined delay time;
    a masking unit for receiving the masking signal in order to keep a logic level of an output signal of the masking unit as a predetermined logic level regardless of an output signal of the delay unit; and
    a plurality of inverters for receiving an output signal of the masking unit to thereby output the auto-precharge signal.

19. The semiconductor memory device as recited in claim 18, wherein the auto-precharge signal output unit includes:
    a precharge detection unit for generating a control signal based on the bank selection signal and the single-bit address signal;
    an initialization unit for initializing an output terminal of the precharge detection unit; and
    a signal output unit for passing an output signal of the precharge detection unit.

20. The semiconductor memory device as recited in claim 19, wherein the precharge detection unit includes:
    a first inverter for inverting the single-bit address signal;
    a first NAND gate for receiving the bank selection signal and an output signal of the first inverter;
    a first PMOS transistor connected between the power supply voltage and the output terminal receiving an output signal of the first NAND gate through a gate of the first PMOS transistor;
    a first NMOS transistor for receiving the bank selection signal through a gate of the first NMOS transistor; and
    a second NMOS transistor connected between the first NMOS transistor and the ground voltage receiving the single-bit address signal through a gate of the second NMOS transistor.

21. The semiconductor memory device as recited in claim 20, wherein the initialization unit includes:
    a plurality of inverters connected in series for receiving the auto-precharge signal;
    a second NAND gate for receiving the auto-precharge signal and an output signal of the plurality of inverters;
    a second PMOS transistor connected between the power supply voltage and the output terminal for receiving the power-up signal through a gate of the first PMOS transistor; and
    a third PMOS transistor connected between the power supply voltage and the output terminal for receiving an output signal of the second NAND gate through a gate of the third PMOS transistor.

22. The semiconductor memory device as recited in claim 21, wherein the synchronization unit includes:
    a third NAND gate for receiving the data access period termination signal and the interrupt bank signal; and
    a fourth NAND gate for receiving an output signal of the third NAND gate and an output signal of the signal output unit.

23. The semiconductor memory device as recited in claim 22, wherein the masking unit includes:
    a second inverter for inverting the masking signal;
    a third inverter for inverting an output signal of the delay unit; and
    a fifth NAND gate for receiving an output signal of the second inverter and an output signal of the third inverter.

* * * * *